United States Patent [19]

Lanzi et al.

[11] Patent Number: 5,521,511
[45] Date of Patent: May 28, 1996

[54] METHOD AND DEVICE FOR TESTING INTEGRATED POWER DEVICES

[75] Inventors: Adriano Lanzi, Nerviano; Giovanni Avenia, Gorgonzola; Elia Pagani, Bergamo, all of Italy

[73] Assignee: SGS-Thomson Microelectronics S.r.L., Agrate Brianza, Italy

[21] Appl. No.: 233,645

[22] Filed: Apr. 26, 1994

[30] Foreign Application Priority Data

Apr. 30, 1993 [EP] European Pat. Off. ............. 93830186

[51] Int. Cl.⁶ ........................................... G01R 31/08
[52] U.S. Cl. ...................... 324/522; 324/718; 324/713; 324/771; 324/537
[58] Field of Search ..................... 324/771, 713, 324/715, 718, 537, 522; 374/183

[56] References Cited

U.S. PATENT DOCUMENTS

| | | | |
|---|---|---|---|
| 5,166,627 | 11/1992 | Kitka et al. | 324/718 |
| 5,171,091 | 12/1992 | Krüger et al. | 374/183 |
| 5,351,010 | 9/1994 | Leopold et al. | 324/713 |

FOREIGN PATENT DOCUMENTS

A075079  3/1983  European Pat. Off. ........ G01R 31/28
A0351911  1/1990  European Pat. Off. ........ G01R 31/26

*Primary Examiner*—Kenneth A. Wieder
*Assistant Examiner*—Kourosh Cyrus Khosravi
*Attorney, Agent, or Firm*—David M. Driscoll; James H. Morris

[57] ABSTRACT

A test method whereby a high current is supplied to a first pin of an integrated device to be tested, and the variation in the voltage drop between the first pin and a second pin on the device to be tested is determined; the two pins being connected to two pads in turn connected, inside the device to be tested, by a low-voltage-drop path. The variation in the voltage drop of the device to be tested is compared with the measured nominal variation of an undoubtedly sound device of the same type, to determine any excessive deviation indicative of deficiency. The supply current in fact results in power dissipation, local heating and, consequently, a variation in the resistance of the connecting wires or of the die attachment to the lead frame, the extent of which differs according to whether only one or both of the wires of a two-wire connection to be tested are present, and according to whether the die is attached properly, poorly or badly to the lead frame. This variation in resistance is reflected in the amount or speed by which the detected voltage drop varies, thus enabling sound parts to be distinguished from faulty ones.

12 Claims, 2 Drawing Sheets

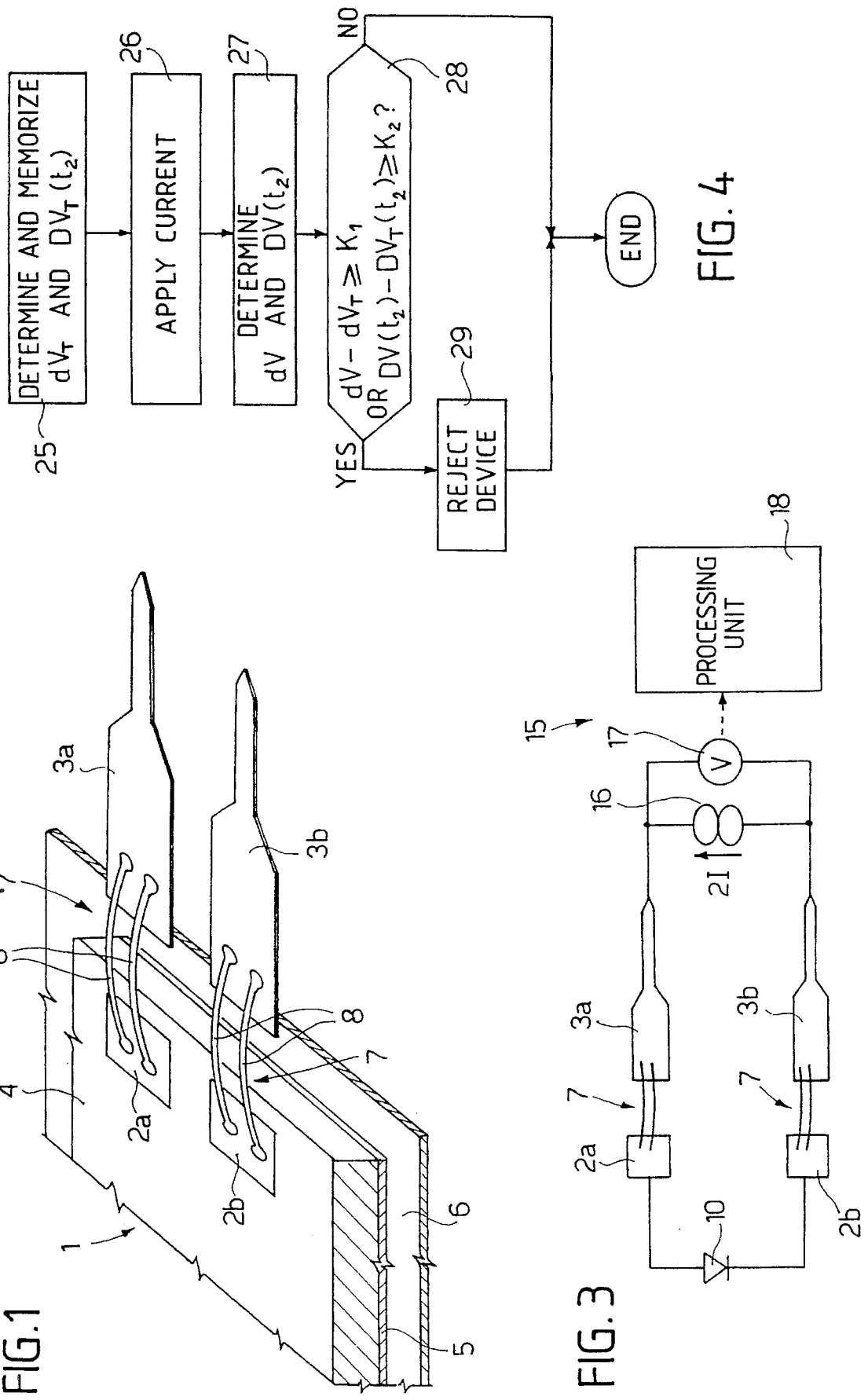

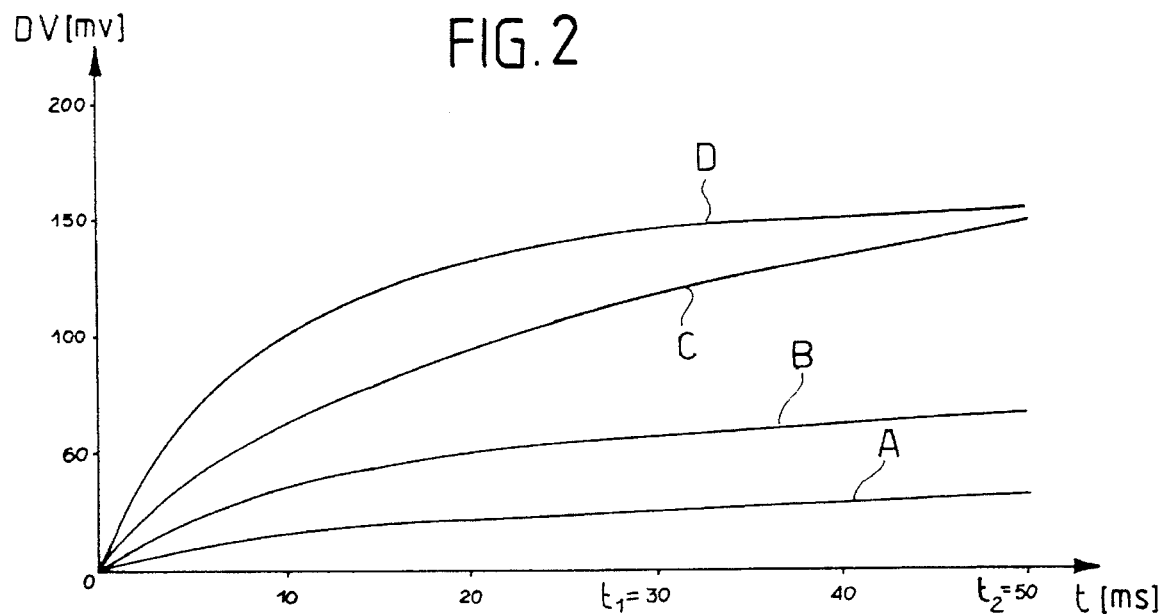
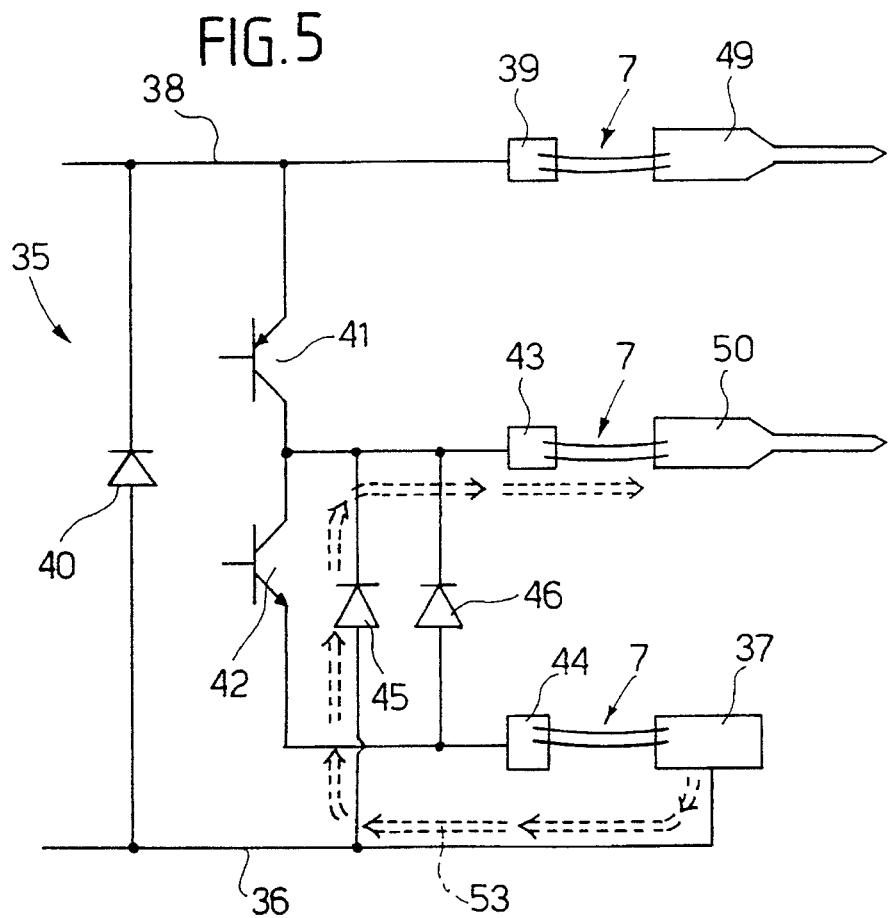

METHOD AND DEVICE FOR TESTING INTEGRATED POWER DEVICES

BACKGROUND OF THE INVENTION

1. Field of the Invention

The present invention relates to a method and device for testing integrated power devices.

2. Discussion of the Related Art

As known, on many integrated power devices, each contact pad on the device is connected to a corresponding pin on the lead frame using two parallel wires, to increase the maximum current withstandable by the connection over the maximum using one wire. A 2 mil gold wire, for example, is incapable of withstanding indefinitely a current of over 2 A, so a second wire is added parallel to the first to double the current capacity.

The problem therefore arises of automatically testing the integrity and correct bonding of both the wires. The bonding process currently employed involves a defect rate of roughly 50–100 ppm. Traditional test methods, however, such as measuring pin-to-pin continuity, fail to discriminate between a faulty connection in which only one wire of a two-wire connection is present, and correct connection of both wires, because the resistance of gold wires is negligible as compared with the overall resistance of the circuit under test. For example, a 2 mil, 3 mm long gold wire presents a resistance of 33 mΩ. Assuming the test is conducted using 1 A current, the voltage, drop will be 33 mV, which is roughly a hundred times smaller than the roughly 3 V voltage drop across the series diode normally provided between the contact pads. Production tolerances result in a distribution of the voltage drop across the diode which renders detection of the differences in voltage drop due to the presence of one as opposed to two wires undetectable.

One known solution to the above problem consists in providing two contact pads connected by a corresponding wire to the same pin. While enabling testing in the conventional way, such a solution involves an increase in the area of the device, due to the greater number of contact pads employed. In view of the current tendency towards ever increasing miniaturization of integrated circuits and devices, increasing device area is strictly undesirable.

Moreover, on power devices, the necessity frequently arises of testing attachment of the die to the lead frame in the areas involving the power elements of the circuit (typically the final power stages) for ensuring adequate power dissipation.

It is a general goal of the present invention to provide a test method designed to overcome the drawbacks typically associated with known methods.

SUMMARY OF THE INVENTION

According to the present invention, there is provided a method of testing power devices having at least one contact pad, each connected by a plurality of bonding wires to a pin. According to one aspect of the invention, the method comprises the steps of: supplying electric power through the pin, bonding wires and contact pad of the power device, producing power dissipation in the bonding wires, a return path for the electric power supplied being of a low power dissipation; determining a variation over time of the power dissipation produced by the step of supplying; and comparing said variation in time with a predetermined nominal variation.

Another aspect of the present invention is a device for testing power devices. The apparatus may comprise: a source of electric power, having an output suitable for connection to the pin of the device; an electric meter having an input suitable for connection to the pin of the device and having an output correlated to electric power dissipation of a circuit connected to the input of the electric meter; and a processor including means for determining a variation in electric power dissipation over time from the output of the electric meter, and means for comparing the variation with a predetermined nominal variation.

Finally, according to yet another aspect, of the present invention, there is provided a testable integrated device comprising: at least one contact pad; and a low power dissipation return path from the at least one contact pad. The low power dissipation return path may include a low-voltage-drop diode.

BRIEF DESCRIPTION OF THE DRAWINGS

One embodiment of the present invention will be described by way of example with reference to the accompanying drawings, wherein common elements are designated by common reference numerals, and in which:

FIG. 1 shows a view in perspective of two two-wire connections between two contact pads of an integrated power device and respective pins;

FIG. 2 shows a graph of electrical quantities employed in the method according to the present invention;

FIG. 3 shows a circuit diagram of the test device according to the present invention, for, testing the two-wire connections in FIG. 1;

FIG. 4 shows a flow chart of one embodiment of the method according to the present invention;

FIG. 5 shows the electric diagram of a portion of an integrated device to which the present method is applied.

DETAILED DESCRIPTION OF THE DRAWINGS

FIG. 1 shows a portion of an integrated device 1 of which the connections between contact pads 2a, 2b and respective pins 3a, 3b are to be tested. The die 4 of device 1 is fixed to a die-attach part of a lead frame 6 by a known bonding layer 5, and pads 2 are connected to corresponding pins 3 by corresponding two-wire connections 7, each consisting of two parallel gold wires 8.

The method according to the present invention is based on the fact that a two-wire connection supplied with fairly high current, dissipates a considerable amount of power in the wires, which are thus heated. Consequently, as the resistance of gold wires depends closely on temperature, by monitoring the voltage drop produced by the current as a function of time, it is possible to distinguish between correct two-wire connections and faulty connections, in Which only one of the two wires has been correctly bonded. In fact, with the same current supply, if only one wire is present, all the current will flow through that one wire, resulting in four times the power dissipation of a correct connection, in which the current is divided substantially equally between the two wires. In the event of a faulty connection, therefore, a greater, increase in the temperature occurs, a greater increase in the resistance occurs and, hence, a higher voltage drop across the wire occurs. By comparing the voltage drop as a function of time with that of the same connection on a part known to be sound, it is possible to determine the absence of one of the wires.

Moreover, monitoring the voltage drop produced by a high current supply also provides for testing attachment of the die to the lead frame in the areas involving the power elements of the circuit. Poor attachment, such as air pockets between the corresponding die region and the lead frame, results in a more rapid increase in die-lead frame thermal resistance and, hence, in a change in thermal behavior. As such, parts with poorly attached dies may be detected by measuring the speed at which the voltage drop varies over a predetermined time period after the high current is applied, and by comparing this with a standard, value. In this case, the pads need not necessarily be two-wire connected to the pin, the only requirement being that the device be an integrated power device with a high degree of power dissipation through the lead frame, and to which, among other things, a high current may be supplied for adequately differentiating between the behavior of parts with correctly, poorly, or badly attached dies.

By way of explanation, the FIG. 2 graph shows the normalized voltage drop DV With respect to the value measured at the start instant, i.e. by subtracting from the value measured at each instant the initial voltage drop value measured immediately following application of the current. In particular, the curves show the normalized voltage drop DV resulting from supplying a constant high current between two pins two-wire-connected to respective pads in turn mutually connected by a diode. FIG. 2 shows four curves relative to experimental measurements conducted on four theoretically identical parts, but with different wire connection or die attachment problems. Curve A shows the results of a series of measurements conducted on a part presenting both the two-wire connections and a correctly attached die; curve B, a part presenting the two-wire connections but a poorly attached die; curve C, a part lacking one of the wires on one of the connections; and curve D, a part presenting the two-wire connections but a badly attached die. As can be seen, in the event of a disconnected wire or badly attached die (curves C and D), after a given time interval, e.g. 40–50 ms, voltage drop DV is considerably greater than that of a perfectly sound part (curve A) or one with a poor, though still acceptable, die attachment (curve B). On the basis of the above information alone, therefore, it is possible to distinguish between sound and defective parts. In addition, however, it is possible to determine whether the problems involved are due to the absence of one of the wires or to a badly attached die by evaluating the voltage drop over the final portion of the measurement. In fact, over the final portion, curve D showing measurement I of a part having a badly attached die presents twice the slope of curve C showing measurement of a part having the absence of one wire. Each may be distinguished by simply monitoring DV over the final portion of the measurement.

One embodiment of the test device and method according to the present invention will now be described with reference FIGS. 3 and 4.

FIG. 3 show the circuit diagram of device 1 in FIG. 1, wherein pads 2a and 2b are assumed mutually connected by a diode 10. Pins 3a and 3b are connected to the test device indicated by 15 and including a current source 16 series connected between pins 2a and 2b; a voltage measuring element 17 parallel to source 16; and a processing unit 18, which may, of course, incorporate voltage measuring element 17. When a current 2I is supplied by source 16, therefore, in the event each connection 7 presents both wires 8 each wire 8 will be supplied with current I, thus resulting in current dissipation of $RI^2$, where R is the resistance of the wire. R is variable is a function of time. Conversely, if one of the wires of even only one of connections 7 is absent, the remaining wire in the same connection is supplied with the whole of current 2I, thus resulting in current dissipation of $4RI^2$, that is, four times the dissipation of a correct connection. The wire of the one-wire connection therefore presents a higher temperature and produces a more rapidly increasing voltage drop as compared with the part with a correct, two-wire, connection.

The method according to the present invention therefore consists initially in measuring and storing data relative to undoubtedly sound parts, i.e. having both two-wire connections and a good die attachment. For this purpose, a high current is supplied. By a high current is meant a current high enough to cause an evident variation in the thermal resistance of the wire and in the die attachment, e.g. 5 A. The resulting normalized voltage drop is measured, for example, by sampling it at successive instants. Voltage drop $DV_T(t)$ is thus determined at a given instant $t_2$ (e.g. after 50 ms), and a quantity is calculated correlated to the slope of the curve at the final step, e.g. the difference $dV_T$ between the DV values measured at two successive instants $t_1$ and $t_2$ according to the equation:

$$dV_T = DV_T(t_2) - DV_T(t_1).$$

This step is indicated in FIG. 4 by block 25.

The same high current is then supplied to the device for testing (block 26). The corresponding DV values at instant $t_2$, and the difference $dV = DV(t_2) - DV(t_1)$ between DV at instants $t_2$ and $t_1$ are measured (block 27).

The correct values $DV_T(t_2)$, $dV_T$ are then compared in block 28 with the test values $DV(t_2)$, $dV$, and, in the event the difference between even one of the test values and the respective nominal value exceeds a corresponding predetermined value of either $K_1$ or $K_2$ (YES output of block 28), the part is rejected (block 29). Conversely, if no test value exceeds a corresponding predetermined value, then the test is terminated. Values $K_1$ and $K_2$ are conveniently determined on the basis of deviation σ of a group of undoubtedly sound devices (e.g. $K_1 = K_2 = 6$ σ).

The FIG. 4 process is repeated for all the two-wire connections for testing, or at any rate for all the connections with power regions whose die attachment is to be tested.

The advantages of the method and device according to the present invention will be clear from the foregoing description. In particular, they provide for safely selecting the absence of even only one wire in a two-wire connection, thus ensuring top quality and, reliability of the passed devices, and with no increase in the area of the device because doubling the number or area of the power contact pads is not required.

Moreover, the solution described is easily implemented, requires no complicated hardware, and provides for extremely high-speed testing in 30–50 ms.

Finally, as already stated, in addition to determining, the presence of both wires in two-wire connections, the method and device described also provide for simultaneously testing die attachment in the power elements, including the output power stages.

To those skilled in the art it will be clear that changes may be made to the method and device described and illustrated herein without, however, departing from the scope of the present invention. In particular, the present method may be applied to any pair of pins, providing the respective pads are mutually connected by a low-voltage path, and especially for any pair of power pins when the voltage drop produced by the internal path is normally no more than 4–5 V.

Generally speaking, the method describe does not apply to testing such two-wire connections to a die-attach part of the lead frame as on the emitter of bottom NPN transistors of audio power devices, in which case the current flows through the substrate, rather, than the two-wire connection, as shown in FIG. 5, FIG. 5 shows the final stage 35 of an audio power device. The FIG. 5 example shows a substrate indicated by line 36 and connected to a die-attach part 37 of the lead frame; a supply line 38 connected to a pad 39; a diode 40 interposed between lines 36 and 38; and two final power transistors—PNP transistor 41 and NPN transistor 42—series connected between lines 38 and 36.

More specifically, transistor 41 is connected by the emitter to supply line 38 and by the connector to pad 43, which is also connected to the collector of transistor 42. The emitter of transistor 42 is in turn connected to pad 44. A diode 45 is interposed between substrate 36 and pad 43, with its anode connected to, or formed directly by, substrate 36. A diode 46 is interposed between the collector and emitter of transistor 42 (with the anode connected to the emitter); and pads 39, 43 and 44 are connected respectively by a two-wire connection 7, to pins 49, 50 and die-attach part 37.

Assuming to begin with that diode 46 is absent, a reasonable assumption in the great majority of cases, to test the two-wire connection 7 between die-attach part 37 and pad 44, it is not enough to supply current to die-attach pant 37 and measure the voltage drop between this and, for example, pin 50, because the current would follow the path indicated by the double dotted line 53, and would flow directly from die-attach part 37 to substrate 36 and through diode 45 and pad 43 to pin 50. To solve this problem, a diode 46 is provided between pads 43 and 44, and preferably of the same size as pad 44, so as to enable the current to flow from die-attach part 37 through two-wire connection 7 to pad 44, and through diode 46 and pad 43 to pin 50. Thus, the voltage drop produced by the current may be measured as described above. In view of the size and location of the diode 46 provided, such a solution would provide for also testing the two-wire connection towards the lead frame with no increase in the area of the device.

As already stated, the present method and device may also be applied to power devices not featuring two-wire connections, for merely testing the die attachment, providing obviously that the pad-pin connections are capable of withstanding high current, for example, a few Amps.

Finally, the present method may be employed in dual mode, by applying a voltage of a given value or pattern, monitoring the current pattern produced by the thermal resistance of the wires or the die-lead frame attachment, and comparing it with correct values for detecting faulty devices.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intended as limiting. The invention is limited only as defined in the following claims and the equivalents thereto.

What is claimed is:

1. A method of testing an integrated power device having contact pads connected by power connections to respective pins comprising the steps of:

supplying a first electric quantity between two pins of the integrated power device, the two pins being connected to two pads connected by a low-voltage-drop path inside the integrated power device;

causing a variation in power dissipation due to the first electric quantity supplied, by supplying a sufficiently large magnitude of the first electric quantity;

measuring the variation in time of a second electric quantity correlated to the first electric quantity by the power dissipation produced by said first electric quantity; and comparing said variation in time with a predetermined nominal variation.

2. A method as claimed in claim 1, wherein said first electric quantity is a high current, and said second electric quantity is a voltage drop between said pins.

3. A method as claimed in claim 2, wherein said current is constant.

4. A method as claimed in claim 2, for determining the absence of a wire in a two-wire connection between a pin and pad, wherein said step of determining said variation in time further comprises the step of:

measuring the voltage between said pins after a predetermined time interval from when said current is supplied.

5. A method as claimed in claim 2, for detecting poor attachment of a die on which the integrated power device is formed to a lead frame, wherein said step of measuring said variation further comprises the step of:

determining a slope of the variation in time of said voltage drop over a predetermined time interval.

6. A method as claimed in claim 5, wherein said step of determining said slope further comprises the steps of:

measuring said voltage drop at two successive instants; and determining the difference between the values measured at said two successive instants.

7. A method as claimed in claim 6, further comprising the steps of:

determining said predetermined nominal variation on the basis of at least one reference integrated device identical to the integrated power device and presenting correct connections and die attachment; and storing said predetermined nominal variation.

8. A method as claimed in claim 7, wherein said step of determining said predetermined nominal variation further comprises the steps of:

supplying said high current to a first pin on said reference integrated device corresponding to said first pin on said integrated device to be tested; and determining the predetermined nominal variation to be a variation in time of a voltage-drop-correlated quantity of said reference integrated device.

9. A method of testing an integrated circuit device having at least two connection pins internally connected in the integrated circuit by a series of elements having a low voltage drop, the method comprising the steps of:

supplying a first electrical quantity to the two pins;

causing, by the step of supplying, gradual heating of the series of elements;

measuring a change over time of a second electrical quantity whose value correlates with the gradual heating.

10. A method as claimed in claim 9, wherein the series of elements includes a plurality of bond wires connecting one of the connection pins to the integrated circuit, the step of causing further comprising:

heating the bond wires connecting the one of the connection pins to the integrated circuit.

11. A method as claimed in claim 9, further comprising the steps of:

changing the resistance of the series of elements as a result of the step of causing gradual heating.

12. A method as claimed in claim 9, further comprising the steps of:

comparing the measured change over time with a predetermined nominal change over time measure on a reference device.

* * * * *